United States Patent
Wang

(10) Patent No.: US 8,519,797 B2
(45) Date of Patent: Aug. 27, 2013

(54) POWER AMPLIFIER AND METHOD FOR CONTROLLING POWER AMPLIFIER

(75) Inventor: Po-Chih Wang, Kao-Hsiung (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 92 days.

(21) Appl. No.: 13/226,467

(22) Filed: Sep. 6, 2011

(65) Prior Publication Data

US 2012/0056678 A1    Mar. 8, 2012

(30) Foreign Application Priority Data

Sep. 7, 2010    (TW) .............................. 99130163 A

(51) Int. Cl.
*H03F 3/04*    (2006.01)
(52) U.S. Cl.
USPC .......................................... 330/311; 330/296
(58) Field of Classification Search
USPC .................... 330/311, 310, 296, 285
See application file for complete search history.

(56) References Cited

U.S. PATENT DOCUMENTS

| | | | |
|---|---|---|---|
| 6,504,431 B2 | 1/2003 | Weber et al. | |
| 6,590,456 B2 * | 7/2003 | Yang | 330/311 |
| 6,636,119 B2 * | 10/2003 | Vathulya | 330/311 |
| 6,724,259 B2 * | 4/2004 | Tanabe | 330/285 |
| 6,784,740 B1 * | 8/2004 | Tabatabaei | 330/279 |
| 6,822,518 B1 * | 11/2004 | Lin et al. | 330/296 |
| 6,850,120 B2 * | 2/2005 | Heima et al. | 330/311 |
| 7,138,876 B2 | 11/2006 | Behzad | |
| 7,199,670 B2 | 4/2007 | Behzad | |

* cited by examiner

*Primary Examiner* — Henry Choe
(74) *Attorney, Agent, or Firm* — Winston Hsu; Scott Margo

(57) ABSTRACT

A power amplifier includes a first transistor, a second transistor and a bias voltage generator. The first transistor includes a gate electrode, a first electrode and a second electrode, where the gate electrode is coupled to a signal input terminal of the power amplifier. The second transistor includes a gate electrode, first electrode and a second electrode, where the second electrode of the second transistor is connected to the first electrode of the first transistor, and the first electrode of the second transistor is coupled to a signal output terminal of the power amplifier. The bias voltage generator is coupled to the second transistor, and is utilized for generating a bias voltage to bias the electrode of the second transistor, where the bias voltage is less than a supply voltage of the power amplifier.

10 Claims, 5 Drawing Sheets

POWER AMPLIFIER AND METHOD FOR CONTROLLING POWER AMPLIFIER

BACKGROUND OF THE INVENTION

1. Field of the Invention

The present invention relates to a power amplifier, and more particularly, to a cascode power amplifier and a method for controlling a cascode power amplifier.

2. Description of the Prior Art

Due to each communication system has its own signal modulation method, a power emitter built in the communication system has a unique specification. Power amplifiers with higher linearity are usually required because the orthogonal frequency division multiplexing (OFDM) modulation signals adopted by standards 802.11a, 802.11b and 802.11g have a high peak-to-average power ratio (PAPR). In addition, the high PAPR signal will damage transistors of the power amplifier due to hot carrier impact and oxide layer breakdown, causing the life cycles of the transistors to be reduced and often resulting in permanent damage. Therefore, it is preferable that the power amplifier have a cascode structure to prevent its transistors from being damaged by a high voltage.

Please refer to FIG. 1. FIG. 1 is a diagram illustrating a prior art cascode power amplifier 100. As shown in FIG. 1, the cascode power amplifier 100 is used for amplifying an input signal Vin to output an output signal Vout. The cascode power amplifier 100 comprises transistors M1 and M2, an inductor L and a capacitor C serving as loadings. To assure that the transistors M1 and M2 can operate in a saturation region, a gate electrode of the transistor M2 is connected to a supply voltage $V_{DD}$. In addition, the transistor M1 is a core device to make the caocode power amplifier have a better frequency response, and the transistor M2 is an input/output (I/O) device for sustaining a high output voltage Vout. Because a tolerance of the core device is small (1.2V, for example), a voltage level of a drain electrode of the transistor M1 (i.e. the node N1 shown in FIG. 1) may exceed the tolerance of the transistor M1 when the cascode power amplifier 100 is supplied by a greater supply voltage $V_{DD}$. That could damage gate-drain capacitance Cgd and drain-source capacitance Cds of the transistor M1, and therefore influences the reliability of the transistor M1.

To solve the above-mentioned problem with regards to the reliability of the transistor M1 being influenced due to an over-high voltage at the node N1, a prior art method reduces a channel width of the transistor M2 in order to lower the voltage at the node N1. Reducing the channel width, however, will lower a trans-conductance of the transistor M2, meaning the gain of the cascode power amplifier 100 is also lowered due to a heavier miller effect of the transistor M1.

In addition, because the gate electrode of the transistor M2 is connected to the supply voltage $V_{DD}$, a swing of the output signal Vout of the cascode power amplifier 100 is limited to be less than a threshold voltage $V_{th2}$ of the transistor M2. When the swing of the output signal Vout of the cascode power amplifier 100 is greater than the threshold voltage $V_{th2}$, the transistor M2 operates in a triode region and the output signal Vout is distorted. Furthermore, a drain-base junction of the transistor M2 may be damaged when the cascode power amplifier 100 is working due to the connection between a base electrode of the transistor M2 and a ground voltage GND.

SUMMARY OF THE INVENTION

It is therefore an objective of the present invention to provide a power amplifier and a method for controlling a power amplifier, which can make the power amplifier have a higher linearity and cause reliabilities of transistors in the power amplifier to also be higher, thereby solving the above-mentioned problems.

According to one embodiment of the present invention, a power amplifier comprises a first transistor, a second transistor and a bias voltage generator. The first transistor includes a gate electrode, a first electrode and a second electrode, where the gate electrode is coupled to a signal input terminal of the power amplifier. The second transistor includes a gate electrode, first electrode and a second electrode, where the second electrode of the second transistor is connected to the first electrode of the first transistor, and the first electrode of the second transistor is coupled to a signal output terminal of the power amplifier. The bias voltage generator is coupled to the second transistor, and is utilized for generating a bias voltage to bias the electrode of the second transistor, where the bias voltage is less than a supply voltage of the power amplifier.

According to another embodiment of the present invention, a method for controlling a power amplifier comprises: providing a first transistor, where the first transistor includes a gate electrode, a first electrode and a second electrode, and the gate electrode is coupled to a signal input terminal of the power amplifier; providing a second transistor, where the second transistor includes a gate electrode, first electrode and a second electrode, the second electrode of the second transistor is connected to the first electrode of the first transistor, and the first electrode of the second transistor is coupled to a signal output terminal of the power amplifier; generating a bias voltage to bias the gate electrode of the second transistor, where the bias voltage is less than a supply voltage of the power amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
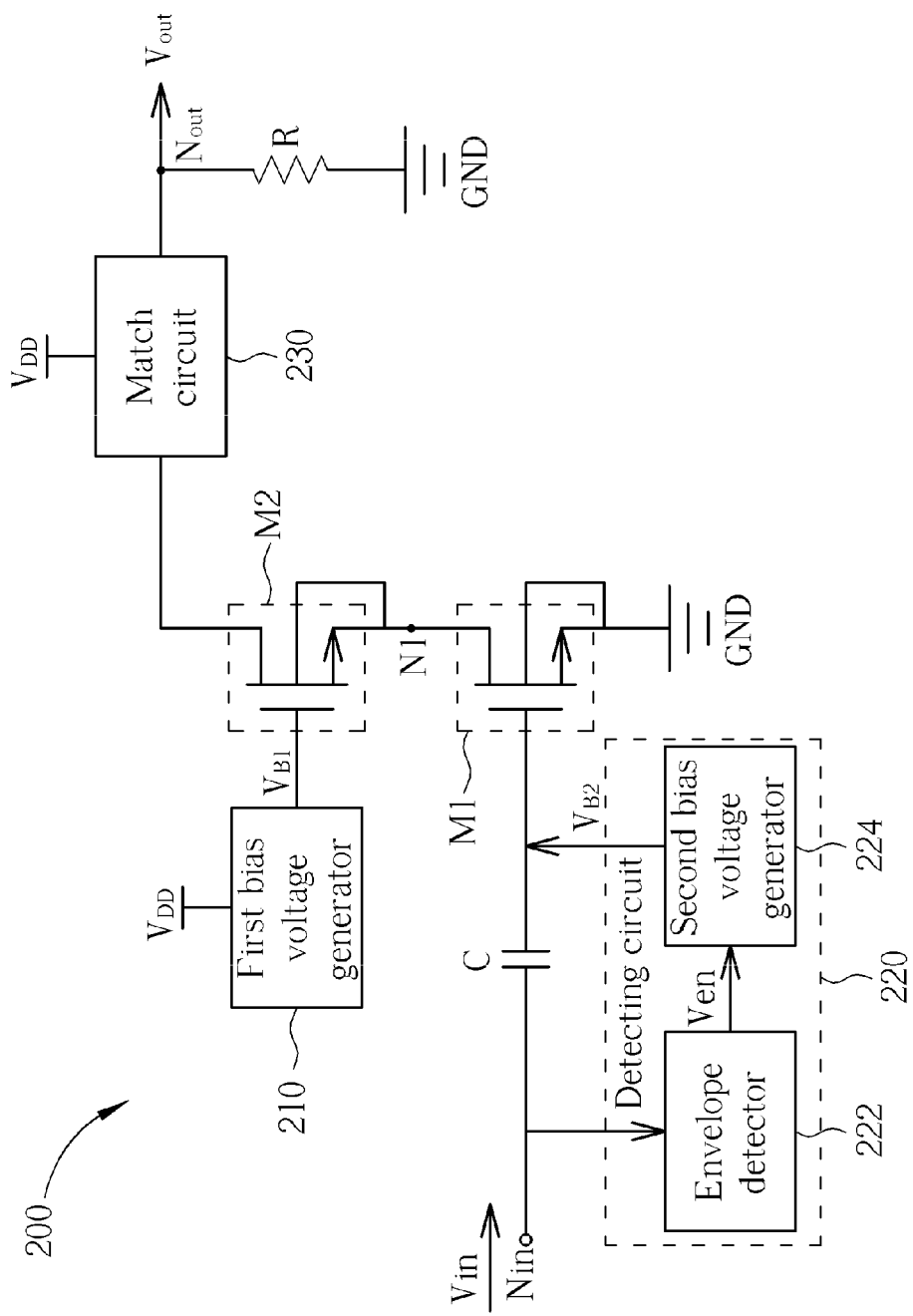
FIG. 2 is a diagram illustrating a power amplifier 200 according to one embodiment of the present invention.

Please refer to FIG. 2. FIG. 2 is a diagram illustrating a power amplifier 200 according to one embodiment of the present invention. As shown in FIG. 2, the power amplifier 200 is utilized for amplifying an input signal Vin at a signal input terminal Nin to generate an output signal Vout at a signal output terminal Nout, and the power amplifier 200 includes a first bias voltage generator 210, a detecting circuit 220, a match circuit 230, transistors M1 and M2, a resistor R and a capacitor C, where the detecting circuit 220 includes an envelope detector 222 and a second bias voltage generator 224. The first bias voltage generator 210 is utilized for generating a bias voltage $V_{B1}$ to bias a gate electrode of the transistor M2 (i.e., a voltage level of the gate electrode of the transistor M2 is biased to be $V_{B1}$), where the bias voltage $V_{B1}$ is less than a supply voltage $V_{DD}$. The detecting circuit 220 is utilized for generating a bias voltage $V_{B2}$ to bias a gate electrode of the transistor M1 (i.e., a voltage level of the gate electrode of the transistor M1 is biased to be $V_{B2}$). In addition, the transistors M1 and M2 can be designed to be devices having a deep well by using a deep well technique, and then the base electrode is connected with the source electrode of the transistor M2 to improve the drain-base junction break down leakage current issue.

In addition, in one embodiment of the present invention, the transistor M1 can be a core device that enables the power amplifier 200 to have a better frequency response, and the transistor M2 can be an I/O device to sustain a high output voltage Vout.

In addition, in another embodiment of the present invention, the bias voltage $V_{B1}$ can be designed to be less than a voltage at the drain electrode of the transistor M2.

Figure 1:
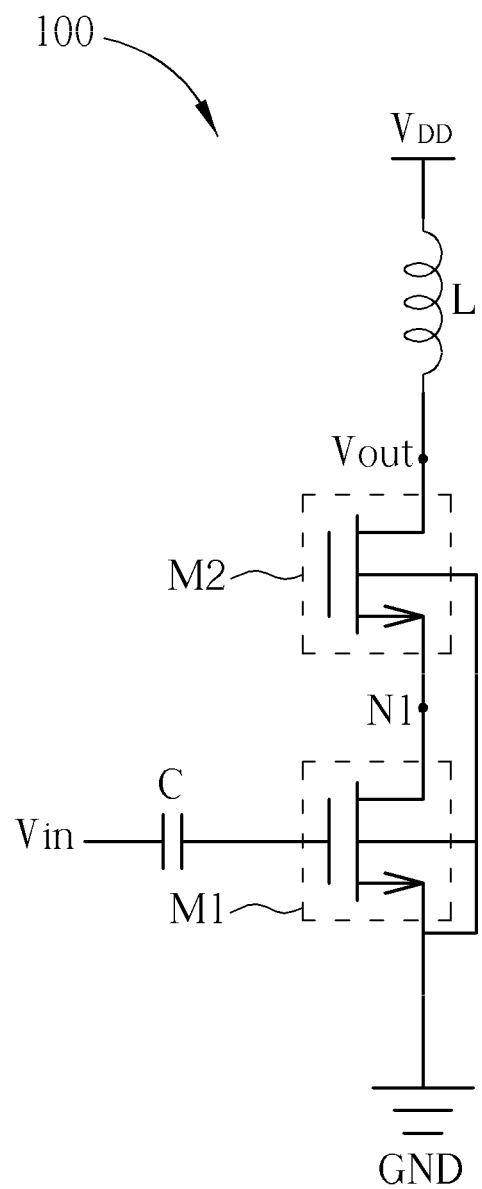
FIG. 1 is a diagram illustrating a prior art cascode power amplifier.

In the operations of the power amplifier 200, because the gate electrode of the transistor M2 is biased to be $V_{B1}$, a voltage $V_{N1}$ at the node N1 (i.e., the drain electrode of the transistor M1 or the source electrode of the transistor M2) is:

$$V_{N1} = V_{B1} - \sqrt{\frac{I_D}{k_n\left(\frac{W}{L}\right)}} - V_{th2},$$

where kn is a trans-conductance parameter, W is a channel width of the transistor M2, L is a channel length of the transistor M2, Vth2 is a threshold voltage of the transistor M2, and $I_D$ is a current value of the transistor M2. Therefore, compared with the conventional cascode power amplifier 100 shown in FIG. 1, a DC voltage at the node N1 is reduced, and the reliability of the transistor M1 is increased because the voltage applied to the transistor M1 is lowered.

In addition, because the gate electrode of the transistor M2 is biased to be $V_{B1}$ (which is less than the supply voltage $V_{DD}$), a swing of the output voltage Vout is $(V_{DD}-V_{B1}-V_{th2})$. Therefore, compared with the conventional cascode power amplifier 100 whose output voltage swing is $V_{th2}$, the power amplifier 200 can increase the swing of the output voltage Vout, and the linearity of the power amplifier 200 is improved.

Furthermore, when the transistor M1 is protected by lowering the voltage at the node N1, the channel width of the transistor M2 can be designed to be wider to give a greater trans-conductance. Therefore, under the same current consumption, the trans-conductance of the transistor M2 of the power amplifier 200 is greater than that of the transistor M2 of the conventional cascode power amplifier 100, and the early effect of the transistor M1 can be improved and the total gain of the power amplifier 200 is increased.

In addition, because the input signal Vin of the power amplifier 200 has an envelope, the amplitude of the input signal Vin is generally within a predetermined range. However, sometimes the amplitude of the input signal Vin may become very large unexpectedly, and the transient voltage (AC voltage) at the node N1 may be pulled high and damage the transistor M1. To solve this problem, the envelope detector 222 detects the envelope strength of the input signal Vin to generate an envelope strength signal Ven. Then, the second bias voltage generator 224 generates the bias voltage $V_{B2}$ to bias the gate electrode of the transistor M1 according to the envelope strength signal Ven, where the envelope strength signal Ven has a positive correlation with the bias voltage $V_{B2}$; that is, the greater the envelope strength signal Ven, the higher the bias voltage $V_{B2}$.

When the bias voltage $V_{B2}$ increases, the current of the transistors M1 and M2 is also increased, and the DC voltage at the node N1 is further decreased. Therefore, when the AC voltage at the node N1 is increased due to an unexpected high strength input signal Vin, the detecting circuit 220 will generate a higher bias voltage $V_{B2}$ to lower the DC voltage at the node N1 to protect the transistor M1. When the strength of the input signal Vin is within a normal range, the detecting circuit 220 will generate a lower bias voltage $V_{B2}$ to decrease the power consumption of the power amplifier 200 (at this time the DC voltage at the node N1 is higher).

In addition, the base electrode and the source electrode of the transistor M2 are connected to each other to prevent the drain-base junction breakdown when the power amplifier 200 is working.

Figure 3:
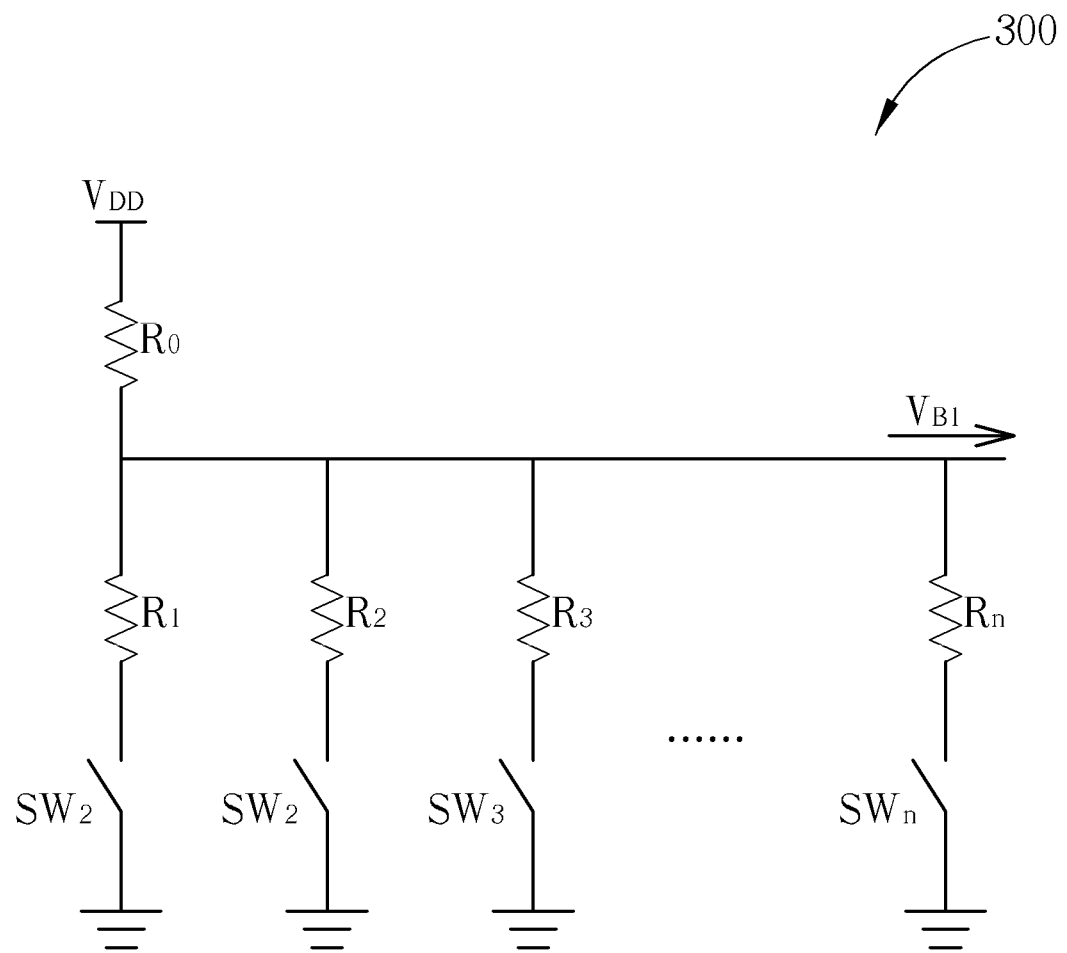
FIG. 3 is a diagram illustrating a first bias voltage generator shown in FIG. 2 according to one embodiment of the present invention.
Figure 4:
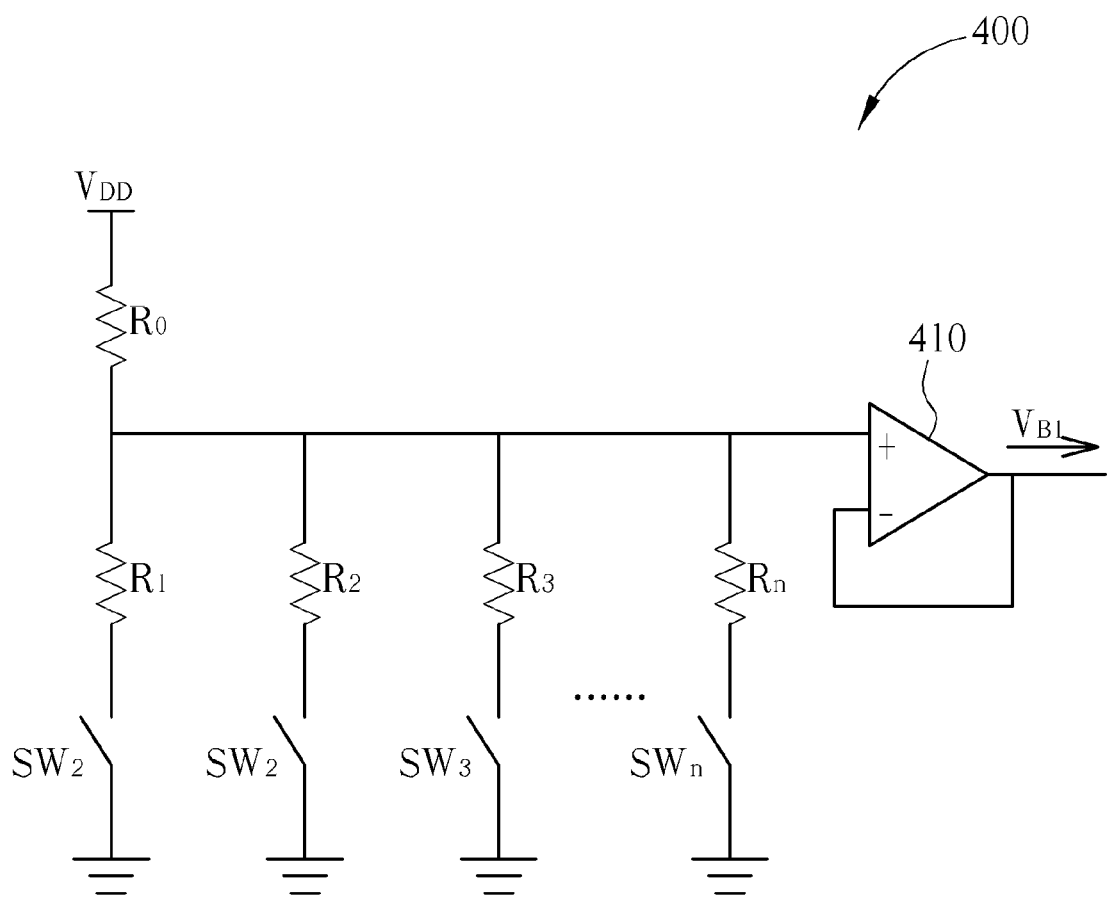
FIG. 4 is a diagram illustrating the first bias voltage generator shown in FIG. 2 according to another embodiment of the present invention.

FIG. 3 and FIG. 4 show two embodiments of the first bias voltage generator 210. Each of the bias voltage generators 300 and 400 (shown in FIGS. 3 and 4, respectively) is for dividing the supply voltage $V_{DD}$ to generate the bias voltage $V_{B1}$. The bias voltage generator 300 includes resistors $R_0$-$R_n$, and switches $SW_1$-$SW_n$. The bias voltage generator 400 includes resistors $R_0$-$R_n$, switches $SW_1$-$SW_n$ and an amplifier 410. In addition, in another embodiment of the present invention, the resistor R0 of the bias voltage generators 300 and 400 can be replaced by a current source. These alternative designs fall within the scope of the present invention.

Figure 5:
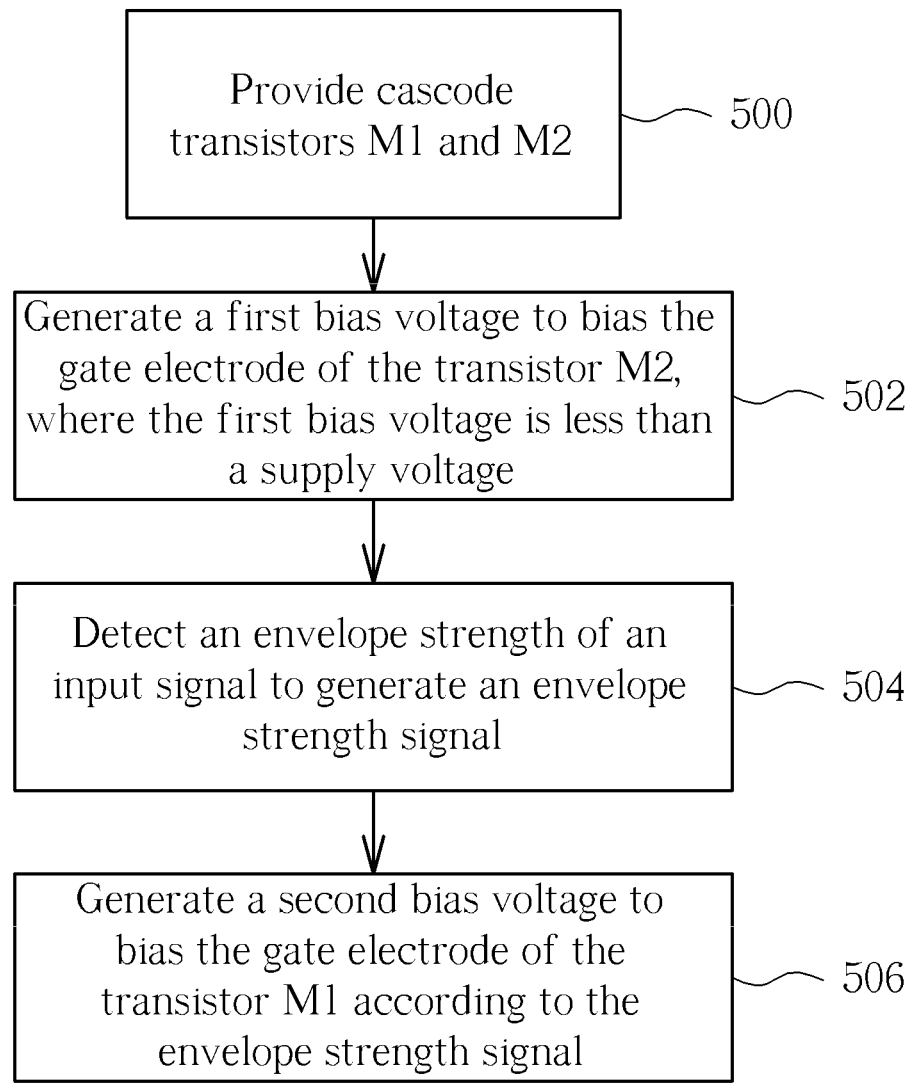
FIG. 5 is a flowchart of a method for controlling a power amplifier according to one embodiment of the present invention.

Please refer to FIG. 2 and FIG. 5 together. FIG. 5 is a flowchart of a method for controlling a power amplifier according to one embodiment of the present invention. Please note that, provided the results are substantially the same, the steps are not limited to be executed according to the exact order shown in FIG. 5. Referring to FIG. 5, the flow is described as follows:

Step 500: Provide cascode transistors M1 and M2 as shown in FIG. 2.

Step 502: Generate a first bias voltage to bias the gate electrode of the transistor M2, where the first bias voltage is less than a supply voltage.

Step 504: Detect an envelope strength of an input signal to generate an envelope strength signal.

Step 506: Generate a second bias voltage to bias the gate electrode of the transistor M1 according to the envelope strength signal.

Briefly summarized, in the power amplifier 200 of the present invention, the gate electrode of the transistor M2 is biased to be a voltage less than the supply voltage VDD, and the detecting circuit 220 determines a bias voltage of the gate electrode of the transistor M1 according to the strength of the input signal of the power amplifier. Therefore, it can prevent the transistor M1 from being of low reliability due to the over-high voltage, and both the linearity and the gain of the power amplifier can be improved.

Those skilled in the art will readily observe that numerous modifications and alterations of the device and method may be made while retaining the teachings of the invention.

What is claimed is:

1. A power amplifier, comprising:
 a first transistor comprising a gate electrode, a first electrode and a second electrode, wherein the gate electrode is coupled to a signal input terminal of the power amplifier to receive an input signal;
 a second transistor comprising a gate electrode, a first electrode and a second electrode, wherein the second electrode of the second transistor is connected to the first electrode of the first transistor, and the first electrode of the second transistor is coupled to a signal output terminal of the power amplifier to output an output signal;

a first bias voltage generator, coupled to the second transistor, for generating a first bias voltage to bias the gate electrode of the second transistor, wherein the first bias voltage is less than a supply voltage of the power amplifier; and a detecting circuit, coupled to the gate electrode of the first transistor, for detecting an input signal received from the signal input terminal of the power amplifier to generate a second bias voltage to bias the gate electrode of the first transistor without utilizing the output signal.

2. The power amplifier of claim 1, wherein the first bias voltage generator divides the supply voltage to generate the first bias voltage.

3. The power amplifier of claim 1, wherein the detecting circuit comprises:

an envelope detector, for detecting an envelope strength of the input signal to generate an envelope strength signal; and a second bias voltage generator, for generating the second bias voltage according to the envelope strength signal.

4. The power amplifier of claim 3, wherein the envelope strength signal has a positive correlation with the second bias voltage.

5. A method for controlling a power amplifier, comprising:

providing a first transistor, wherein the first transistor comprises a gate electrode, a first electrode and a second electrode, and the gate electrode is coupled to a signal input terminal of the power amplifier to receive an input signal;

providing a second transistor, wherein the second transistor comprises a gate electrode, a first electrode and a second electrode, the second electrode of the second transistor is connected to the first electrode of the first transistor, and the first electrode of the second transistor is coupled to a signal output terminal of the power amplifier to output an output signal;

generating a first bias voltage to bias the gate electrode of the second transistor, wherein the first bias voltage is less than a supply voltage of the power amplifier; and detecting an input signal received from the signal input terminal of the power amplifier to generate a second bias voltage to bias the gate electrode of the first transistor without utilizing the output signal.

6. The method of claim 5, wherein the first bias voltage is less than a voltage at the first electrode of the second transistor.

7. The method of claim 5, wherein the step of generating the first bias voltage comprises:

dividing the supply voltage to generate the first bias voltage.

8. The method of claim 5, wherein the step of detecting the input signal received from the signal input terminal of the power amplifier to generate the second bias voltage comprises:

detecting an envelope strength of the input signal to generate an envelope strength signal; and generating the second bias voltage according to the envelope strength signal.

9. The power amplifier of claim 1, further comprising:

a capacitor, coupled to the gate electrode of the first transistor;

wherein the input signal is inputted to the gate electrode of the first transistor via the capacitor.

10. The method of claim 5, further comprising:

inputting the input signal to the gate electrode of the first transistor via a capacitor.

* * * * *